United States Patent
Hong et al.

(10) Patent No.: US 9,583,245 B2
(45) Date of Patent: Feb. 28, 2017

(54) MAGNET PLATE ASSEMBLY, DEPOSITION APPARATUS INCLUDING THE MAGNET PLATE ASSEMBLY, AND DEPOSITION METHOD USING THE MAGNET PLATE ASSEMBLY

(71) Applicant: Samsung Display Co., Ltd., Yongin, Gyeonggi-Do (KR)

(72) Inventors: Minpyo Hong, Yongin (KR); Hongryul Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/657,178

(22) Filed: Mar. 13, 2015

(65) Prior Publication Data

US 2016/0042852 A1 Feb. 11, 2016

(30) Foreign Application Priority Data

Aug. 5, 2014 (KR) ........................ 10-2014-0100701

(51) Int. Cl.
| | |
|---|---|
| H01L 51/56 | (2006.01) |
| C23C 14/04 | (2006.01) |
| H01F 7/02 | (2006.01) |
| H01L 21/677 | (2006.01) |
| C23C 14/34 | (2006.01) |

(52) U.S. Cl.
CPC ......... *H01F 7/0221* (2013.01); *H01F 7/0252* (2013.01); *H01L 21/6776* (2013.01); *H01L 21/67709* (2013.01); *C23C 14/042* (2013.01); *C23C 14/3407* (2013.01); *H01L 51/56* (2013.01)

(58) Field of Classification Search
CPC ......... H01F 7/0221; H01F 7/20; H01L 51/56; H01L 51/0002; C23C 14/3407; C23C 14/042

USPC ............................................ 204/298; 438/34
See application file for complete search history.

(56) References Cited

U.S. PATENT DOCUMENTS

| | | | |
|---|---|---|---|
| 2006/0240669 A1* | 10/2006 | Kaneko | ................ C23C 14/042 438/680 |
| 2010/0025237 A1* | 2/2010 | Kim | ...................... C23C 14/042 204/298.18 |
| 2014/0251800 A1* | 9/2014 | Miller | ................ C23C 14/3407 204/298.08 |

FOREIGN PATENT DOCUMENTS

| | | |
|---|---|---|
| JP | 2001-049422 A | 2/2001 |
| KR | 10-2002-0004541 A | 1/2002 |
| KR | 10-2003-0069679 A | 8/2003 |
| KR | 10-2011-0017503 A | 2/2011 |
| KR | 10-2011-0128579 A | 11/2011 |

* cited by examiner

*Primary Examiner* — Caleen Sullivan
(74) *Attorney, Agent, or Firm* — Knobbe Martens Olson & Bear LLP (57) ABSTRACT

A magnet plate assembly includes a plurality of magnetic substances having predetermined magnetic forces, a magnet supporter supporting at least a corresponding one of the plurality of magnetic substances, and a guide support supporting the magnet supporter and comprising at least one guide opening. The magnetic plate assembly further includes a coupler extending through the at least one guide opening and movable within the at least one guide opening, the coupler being connected to the magnet supporter; and a driver unit connected to the coupler and configured to move the corresponding one of the plurality of magnetic substances with respect to the guide support.

20 Claims, 7 Drawing Sheets

MAGNET PLATE ASSEMBLY, DEPOSITION APPARATUS INCLUDING THE MAGNET PLATE ASSEMBLY, AND DEPOSITION METHOD USING THE MAGNET PLATE ASSEMBLY

RELATED APPLICATION

This application claims the benefit of Korean Patent Application No. 10-2014-0100701, filed on Aug. 5, 2014, in the Korean Intellectual Property Office, the disclosure of which is incorporated herein in its entirety by reference.

BACKGROUND

1. Field

One or more embodiments of the present invention relate to a magnet plate assembly, a deposition apparatus including the magnet plate assembly, and a deposition method using the magnet plate assembly.

2. Description of the Related Art

Generally, organic light-emitting display devices are active light emitting display devices and have wider viewing angles, better contrast characteristics, low voltage driving characteristics, lightweight thin film shapes, and faster response speeds than other display devices, and thus have drawn attention as a next-generation display device.

Such light emitting devices are divided into inorganic light emitting devices and organic light emitting devices according to a material for forming an emission layer. Organic light emitting devices are advantageous to better brightness and response speed characteristics than inorganic light emitting devices and color display, and thus organic light emitting devices have been recently developed.

Organic light emitting display devices use a vacuum deposition method to form organic layer and/or electrodes. However, since organic light emitting display devices become high resolution, widths of open slits of a mask used to perform a deposition process become narrower.

Information disclosed in this Background section may include information already known to the inventors before achieving the present invention or acquired in the process of achieving the present invention. Therefore, it may contain information that does not form the prior art that is already known to the public. Further, the discussions in the Background section does not constitute an admission of the prior art.

SUMMARY

One or more embodiments of the present invention include a magnet plate assembly, a deposition apparatus including the magnet plate assembly, and a deposition method using the magnet plate assembly.

Additional aspects will be set forth in part in the description which follows and, in part, will be apparent from the description, or may be learned by practice of the presented embodiments.

According to one or more embodiments of the present invention, a magnet plate assembly includes a plurality of magnetic substances having predetermined magnetic forces; a magnet supporter supporting at least a corresponding one of the plurality of magnetic substances; a guide support supporting the magnet supporter and comprising at least one guide opening; a coupler extending through the at least one guide opening and movable within the at least one guide opening, the coupler being connected to the magnet supporter; and a driver unit connected to the coupler and configured to move the corresponding one of the plurality of magnetic substances with respect to the guide support.

The magnet supporter may include a first groove that accommodates the corresponding one of the plurality of magnetic substances.

The guide support may include a second groove that accommodates the magnet supporter, wherein the second groove has a greater width than the magnet supporter.

The guide support unit may further include a support bar supporting the driving unit.

The driver unit may include a linear actuator, a cam, or a screw.

The at least one guide opening may be elongated in a direction different from a width direction and a length direction of the guide support.

The magnet supporter may be movable in the direction with respect to the guide unit.

According to one or more embodiments of the present invention, a deposition device includes a deposition source configured to discharge a deposition material toward a substrate; a mask disposed between the deposition source and a substrate to be subject to deposition, and comprising a plurality of slits through which the deposition material emitted from the deposition source passes toward the substrate; and the foregoing magnet plate assembly, wherein the magnet plate assembly is disposed on a side of the substrate opposite to a side of the substrate facing the mask and configured to apply a predetermined magnetic force to the mask to attract the mask toward the substrate.

The deposition device may further include: a cooling plate that is disposed between the substrate and the magnet plate assembly and is configured to apply pressure to the substrate.

According to one or more embodiments of the present invention, a deposition method includes providing a mask, a substrate, and a magnet plate assembly comprising a plurality of magnets in a deposition chamber; arranging the mask, the substrate and the magnet plate assembly such that the substrate is disposed between the mask and the magnet plate assembly, thereby attracting the mask toward the substrate; moving at least one of the plurality of magnets prior to or subsequently to arranging; and depositing a deposition material to the substrate in the deposition chamber using the mask.

The magnet plate assembly may include: a magnet supporter supporting at least a corresponding one of the plurality of magnets; a guide support supporting the magnet supporter and comprising at least one guide opening; and a coupler extending through the at least one guide opening and connected to the magnet supporter, a driver unit connected to the coupler and configured to move the corresponding one of the plurality of magnets with respect to the guide support.

The magnet supporter may include a first groove that accommodates the corresponding one of the plurality of magnetic substances.

The guide support may include a second groove that accommodates the magnetic supporter, wherein the second groove has a greater width than the magnetic supporter.

The at least one guide opening may be elongated in a direction different from a width direction and a length direction of the guide support.

The magnet supporter may be movable in the direction with respect to the guide support.

The deposition method may further include: providing a cooling plate between the magnet plate assembly and the substrate.

The at least one of the magnets may be moved with respect to a surface on which the substrate is placed along a direction substantially parallel to the surface. The at least one of the magnets may be moved along a direction which is substantially parallel to an edge of the substrate. The at least one of the magnets may be moved along a direction which is substantially slanted with respect to an edge of the substrate.

One aspect of the invention provides a method of making an organic light emitting display device, the method comprising: providing a mask, a substrate, and a magnet plate assembly comprising a plurality of magnets in a deposition chamber; arranging the mask, the substrate and the magnet plate assembly such that the substrate is disposed between the mask and the magnet plate assembly, thereby attracting the mask toward the substrate; moving at least one of the plurality of magnets prior to or subsequently to arranging; and depositing a deposition material to the substrate in the chamber using the mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

To manufacture high resolution organic light emitting display devices, it may be needed to minimize or reduce a shadow effect. To this end, the deposition process is performed under the condition that a substrate and the mask are close in contact with each other. Embodiments of the invention provide configurations or features for increasing a close contact between the substrate and the mask.

Figure 1:
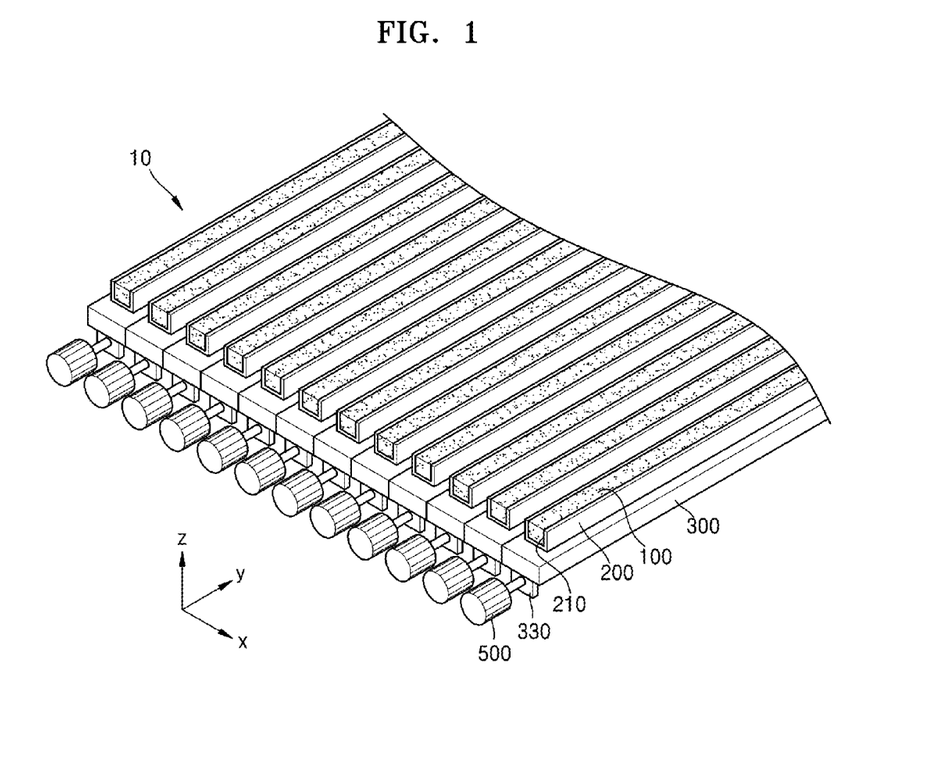
FIG. 1 is a diagram of a magnet plate assembly according to an embodiment of the present invention.
Figure 2:
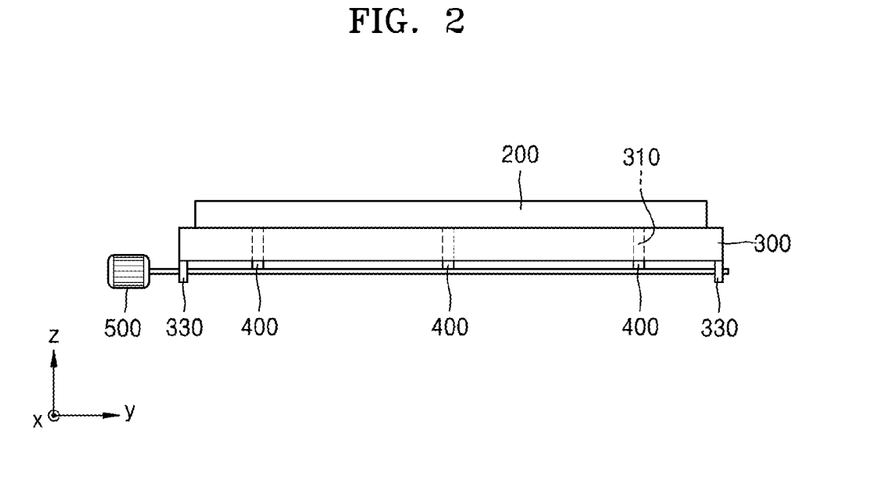
FIG. 2 is a side view of the magnet plate assembly of FIG. 1 according to an embodiment of the present invention.
Figure 3:
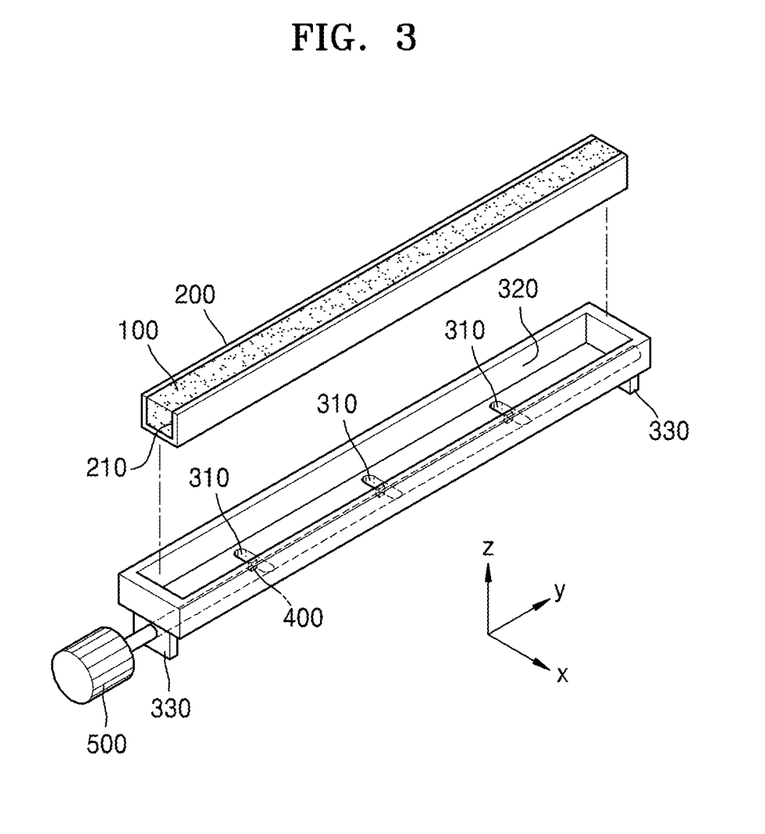
FIG. 3 is an exploded perspective diagram of the magnet plate assembly of FIG. 1 according to an embodiment of the present invention.

FIG. 1 is a perspective view of a schematic configuration of a magnet plate assembly or magnetic chuck 10 according to an embodiment of the present invention. FIG. 2 is a side view of the magnet plate assembly. FIG. 3 is an exploded perspective diagram of the magnet plate assembly 10.

Referring to FIGS. 1 and 2, the magnet plate assembly 10 includes magnetic substances 100, a magnet supporter 200 that supports the magnetic substances 100, a guide unit 300 that supports the magnet supporter 200 and includes one or more openings 310, couplers 400 connected to the magnet supporter 200 via the guide openings 310, and a driving unit 500 connected to the couplers 400 to control a sliding motion of the magnetic substances 100.

In embodiments, the magnetic substances or magnets 100 may be permanent magnets or electromagnets. For magnetic substances, any substances that may generate a magnetic force in addition to the permanent magnets may be used. In other embodiments, an electromagnet, an electrostatic chuck, etc. may be used instead of the permanent magnet. The magnetic substances 100 may be configured as a single magnet having a single N pole and a single S pole to extend in a direction (a y-axis direction of FIG. 1). In alternative embodiments, each of the magnetic substances 100 may split into a plurality of substances so that the N pole and the S pole may be alternately disposed.

Although each of the magnetic substance 100 has a rectangular cross-section, the magnetic substances 100 may have various shapes such as a polygonal shape, a circular shape, or an oval shape. However, the present invention is not limited thereto, and it will be understood by those of ordinary skill in the art that various changes may be made.

The magnet supporter 200, which is an element that functions to support the magnetic substance 100, may include a first groove 210 to accommodate the magnetic substances 100 in the first groove 210 as shown in FIG. 1 but is not limited thereto. A plurality of magnet supporters 200 may be provided such that each supports one of the magnetic substances 100.

Next, the guide unit 300 supports the magnet supporter 200 and includes the one or more openings 310. Referring to FIG. 3, the guide unit 300 may support only one magnet supporter 200 as shown in FIG. 1 but is not limited thereto. The guide unit 300 may include a second groove 320 that accommodates the magnet supporter 200 to carry the magnet supporter 200. However, in this regard, a width of the second groove 320 is greater than that of the magnet supporter 200 in order to provide a space in the second groove 320 in which the magnet supporter 200 may perform the sliding motion within the second groove 320.

Figure 6:
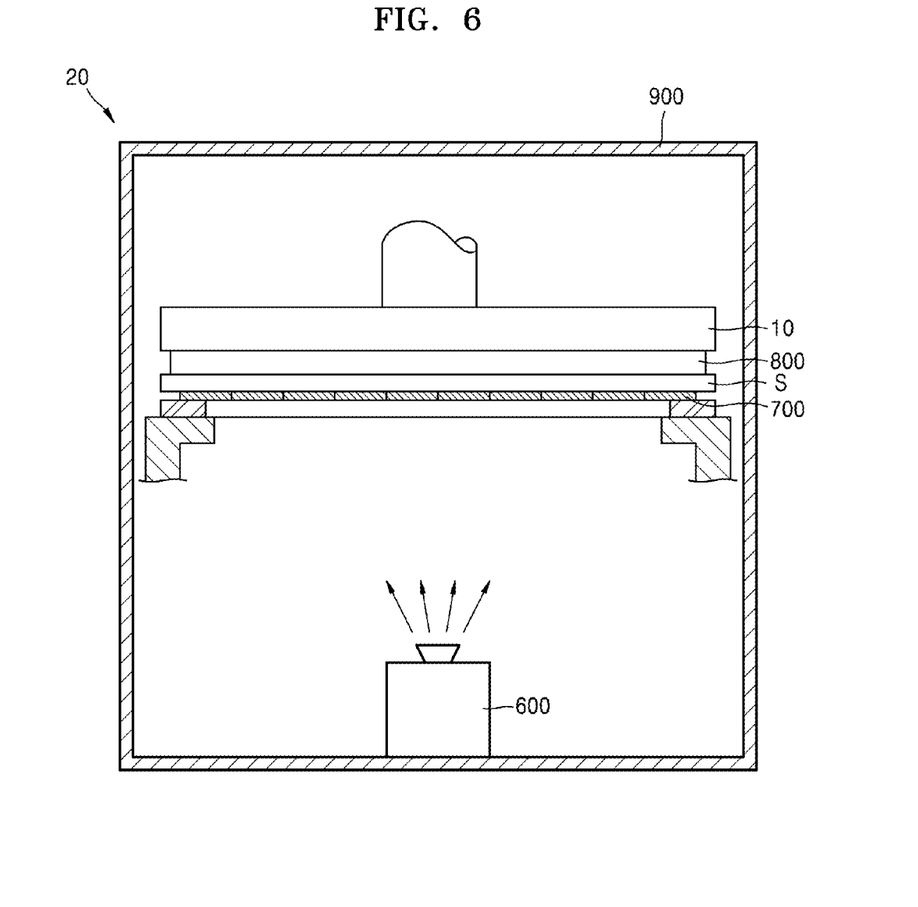
FIG. 6 is a cross-sectional view of a deposition apparatus including the magnet plate assembly of FIG. 1 according to an embodiment of the present invention.

A support bar or support protrusion 330 supports the driving unit 500 and is an element that is connected to the guide unit 300 and functions to hold the driving unit 500 connected to the magnet supporter 200 and the guide unit 300 in a deposition apparatus (20 of FIG. 6).

The coupler 400 is an element that passes through one of the openings 310 and is connected to the magnet supporter 200 and transfers a driving force of the driving unit 500 to the magnet supporter 200 to move the magnet supporter 200.

The driving unit 500 is connected to the coupler 400 and provides a driving force to enable the magnet supporter 200 to slide on the guide unit 300. The driving unit 500 may include a linear actuator that may electrically generate the driving force. In another embodiment, the driving unit 500 may include a cam that may mechanically transfer the driving force. In other embodiments, the driving unit 500 may have a lead screw by which a human may personally apply force. In addition, the driving unit 500 may have any shapes that provide the driving force to move the coupler 400 connected to the driving unit 500 and enable the magnet supporter 200 to slide on the guide unit 300. In embodiments, the driving unit 500 may be controlled to move all of the magnet supporters 200 simultaneously. In other embodiments, the driving unit 500 may be controlled to move one or some of the plurality of magnet supporters 200.

Figure 4:
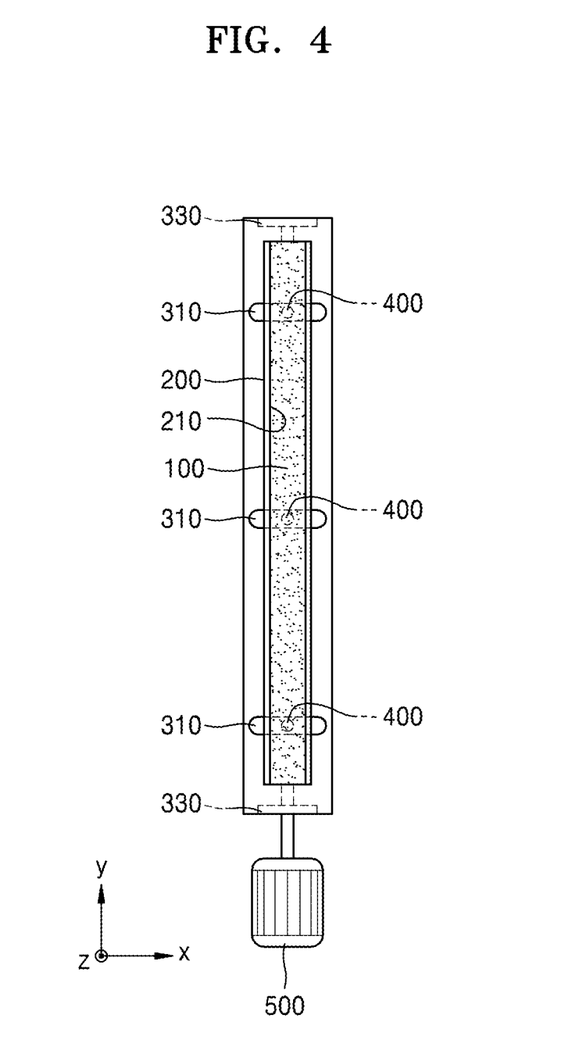
FIG. 4 is a partial top view of the magnet plate assembly of FIG. 1.

FIG. 4 is a top view of the magnet plate assembly 10 of FIG. 1.

Referring to FIG. 4, the magnet supporter 200 slides along a direction in which the openings 310 are elongated on the guide unit 300 by a driving force applied by the driving unit 500. Thus, as shown in FIGS. 3 and 4, when the openings 310 are formed to be elongated in a width direction of the guide unit 300, the magnet supporter 200 connected to the driving unit 500 via the coupler 400 slides in the width direction (an x-axis direction of FIG. 4) of the guide unit 300 in which the openings 310 are formed.

Figure 5:
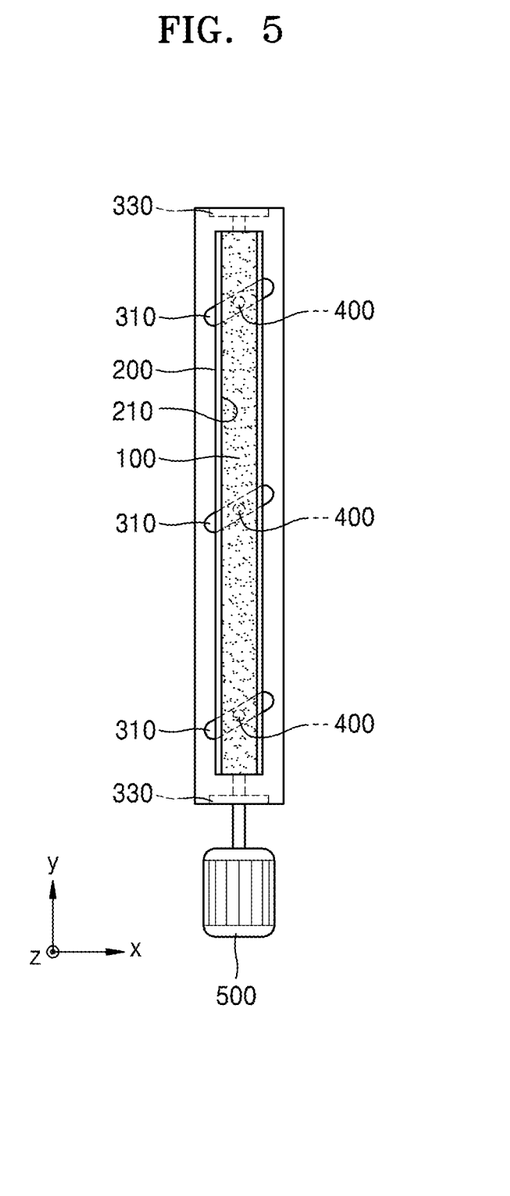
FIG. 5 is a partial top view of a magnet plate assembly according to another embodiment of the invention.

FIG. 5 is a partial top view of a magnet plate assembly 10 including openings 310 elongated in a different direction.

As shown in FIG. 5, when the openings 310 are formed in a third direction different from a width direction (an x-axis direction of FIG. 5) and a length direction (a y-axis direction of FIG. 3) of the guide unit 300, the magnet supporter 200 also moves in the third direction according to a movement direction of the coupler 400 that moves in the third direction within the openings 310.

To manufacture a high resolution display device, it may be required to reduce or minimize a shadow effect that occurs during a deposition process of an organic substance, i.e. a deposition material. The shadow effect occurs due to a space between a substrate on which the deposition material is deposited and a mask that functions to allow the deposition material to pass therethrough via slits. To reduce or minimize the shadow effect, a close contact between the substrate and the mask is accomplished by minimizing the space between the substrate and the mask and preventing the mask from separating from the substrate.

In one example, the mask may be in close contact with the substrate by arranging a plurality of magnetic materials that generate a magnetic force, such as the magnetic substances 100, in a structure like the guide unit 300 in the width direction (x-axis direction of FIG. 5) of the guide unit 300 such that the substrate is disposed between the mask and the materials and the magnetic force of the materials attracts the mask toward the substrate.

However, when the magnetic substances 100 having the same polarity are continuously arranged in the width direction of the guide unit 300 at a uniform space, magnetic forces generated by the magnetic substances 100 are determined according to an arrangement of the magnetic substances 100. If the magnetic substances 100 are fixed to the guide unit 300 and used in a deposition process, since it is difficult to change the arrangement of the magnetic substances 100 later, it is difficult to change intensity or distribution of the magnetic forces during the deposition process until the magnetic substances 100 are exchanged.

Accordingly, the magnet plate assembly 10 of an embodiment of the present invention may further include the driving unit 500 that provides a driving force to the magnet supporter 200 and the coupler 400 that transfers the driving force of the driving unit 500 to the magnet supporter 200.

Since the magnet plate assembly 10 includes the driving unit 500 that provides the driving force to the magnet supporter 200 and the couplers 400 that transfer the driving force of the driving unit 500 to the magnet supporter 200 such that the magnet supporter 200 may slide on the guide unit 300, the magnetic substances 100 supported by the magnet supporter 200 may slide in the width direction of the guide unit 300 or in an oblique direction on the guide unit 300.

When the plurality of magnetic substances 100 are arranged in the width direction (x-axis direction of FIG. 5) of the guide unit 300, predetermined magnetic forces may be formed. Since the driving force of the driving unit 500 is used to slide the magnetic substances 100 on the guide unit 300, it is possible to change the intensity or the distribution of the magnetic forces formed by the magnetic substances 100, thereby forming a uniform magnetic force. Thus, the close contact between the mask and the substrate may be accomplished, and thus the shadow effect that occurs during the deposition process may be minimized or reduced.

FIG. 6 is a cross-sectional view of a deposition apparatus 20 including the magnet plate assembly 10 shown in FIG. 1 according to an embodiment of the present invention.

The deposition device 20 may include a deposition source 600 that discharges a deposition material toward a substrate S, a mask 700 disposed between the deposition source 600 and the substrate S, allowing the deposition material to pass therethrough for depositing the deposition material on the substrate S. The magnet plate assembly 10 according to embodiments of the present invention disposed over a surface of the substrate opposite to another surface of the substrate S facing the mask 700 and applies a predetermined magnetic force to the mask 700.

The deposition device 20 may further include a cooling plate 800 that is disposed between the substrate S and the magnet plate assembly 10 and applies pressure to the substrate S by using a weight thereof. The cooling plate 800 functions to improve a close contact force between the substrate S and the mask 700 before moving the magnetic plate assembly 10 to the substrate S and applying the magnetic force to the mask 700.

Figure 7:
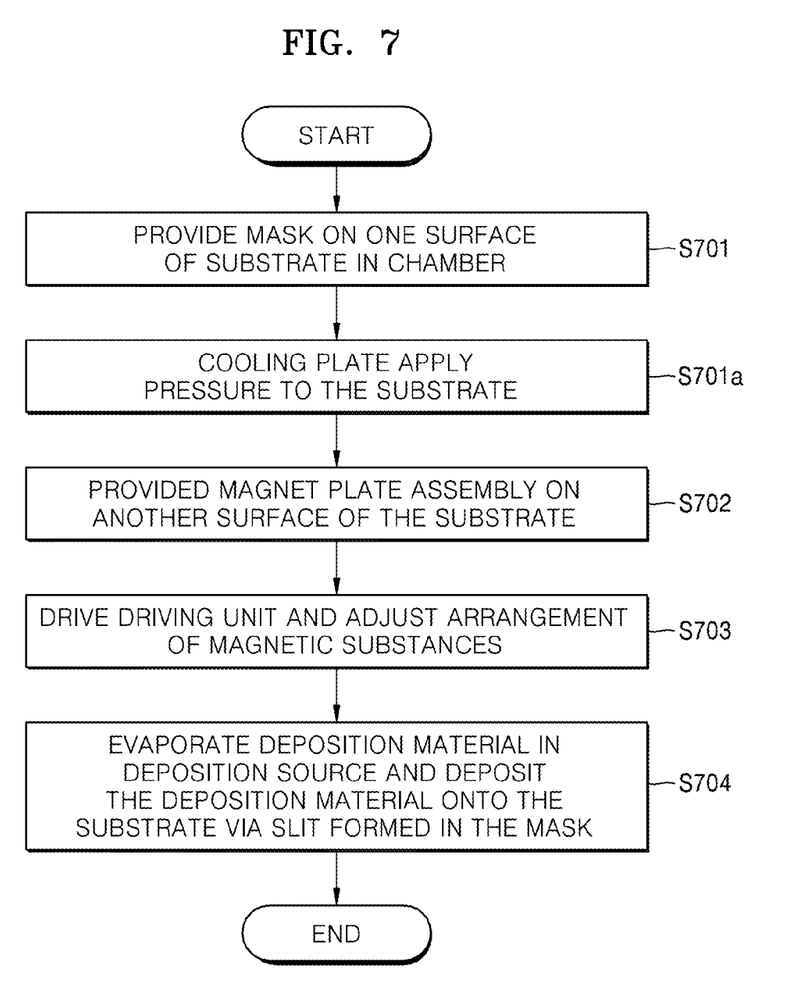
FIG. 7 is a flowchart of a deposition method using the magnet plate assembly of FIG. 1 according to an embodiment of the present invention.

FIG. 7 is a flowchart of a deposition method using the magnet plate assembly 10 of FIG. 1 according to an embodiment of the present invention.

Referring to FIGS. 6 and 7, the mask 700 is provided on or over one surface of the substrate S in a chamber 900 (operation S701). The magnet plate assembly 10 is provided over another surface of the substrate S (operation S702). A magnetic force applied to the mask 700 is controlled by driving the driving unit 500 and adjusting an arrangement of the magnetic substances 100 (operation S703). Thereafter, a deposition material evaporated in the deposition source 700 included in the chamber 900 is deposited onto the substrate S via a slit formed in the mask 700 (operation S704).

In addition, before providing the mask 700 on one surface of the substrate S in the chamber 900 and providing the magnet plate assembly 10 on another surface of the substrate S, the cooling plate 800 may apply pressure to the substrate S by moving in a direction of a surface contacting the magnet plate assembly 10 and the substrate S (operation S701a).

As described above, according to the one or more of the above embodiments of the present invention, a magnet plate assembly, a deposition apparatus including the magnet plate assembly, and a deposition method using the magnet plate assembly provide a uniform magnetic force to a mask, which minimizes a space between a substrate and the mask, thereby precisely depositing a deposition material onto the substrate.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of making an organic light emitting display device, the method comprising:
   providing a mask, a substrate, and a magnet plate assembly comprising a plurality of magnets in a deposition chamber;
   arranging the mask, the substrate and the magnet plate assembly such that the substrate is disposed between the mask and the magnet plate assembly, thereby attracting the mask toward the substrate;
   moving at least one of the plurality of magnets to adjust a distance between two of the plurality of magnets; and
   depositing a deposition material to the substrate in the deposition chamber using the mask.

2. The method of claim 1, wherein the magnet plate assembly comprises:
   a magnet supporter supporting at least a corresponding one of the plurality of magnets;
   a guide support supporting the magnet supporter and comprising at least one guide opening; and
   a coupler extending through the at least one guide opening and connected to the magnet supporter,
   a driver unit connected to the coupler and configured to move the corresponding one of the plurality of magnets with respect to the guide support.

3. The method of claim 2, wherein the magnet supporter comprises a first groove that accommodates the corresponding one of the plurality of magnets.

4. The method of claim 2, wherein the guide support comprises a second groove that accommodates the magnetic supporter,
   wherein the second groove has a width greater than that of the magnetic supporter.

5. The method of claim 2, wherein the at least one guide opening is elongated in a direction different from a width direction and a length direction of the guide support.

6. The method of claim 5, wherein the magnet supporter is movable in the direction with respect to the guide support.

7. The method of claim 2, further comprising providing a cooling plate between the magnet plate assembly and the substrate.

8. The method of claim 1, wherein the at least one of the magnets is moved with respect to a surface on which the substrate is placed along a direction substantially parallel to the surface.

9. The method of claim 1, the at least one of the magnets is moved along a direction which is substantially parallel to an edge of the substrate.

10. The method of claim 1, the at least one of the magnets is moved along a direction which is substantially slanted with respect to an edge of the substrate.

11. A method of making an organic light emitting display device, the method comprising:
    providing a mask, a substrate, and a magnet plate assembly comprising a plurality of magnets in a deposition chamber;
    arranging the mask, the substrate and the magnet plate assembly such that the substrate is disposed between the mask and the magnet plate assembly, thereby attracting the mask toward the substrate;
    moving at least one of the plurality of magnets; and
    depositing a deposition material to the substrate in the deposition chamber using the mask,
    wherein the plurality of magnets is configured to have the same interval between a magnet and an adjacent one while moving at least one of the plurality of magnets.

12. The method of claim 11, wherein the magnet plate assembly comprises:
    a magnet supporter supporting at least a corresponding one of the plurality of magnets;
    a guide support supporting the magnet supporter and comprising at least one guide opening; and
    a coupler extending through the at least one guide opening and connected to the magnet supporter,
    a driver unit connected to the coupler and configured to move the corresponding one of the plurality of magnets with respect to the guide support.

13. The method of claim 12, wherein the magnet supporter comprises a first groove that accommodates the corresponding one of the plurality of magnets.

14. The method of claim 12, wherein the guide support comprises a second groove that accommodates the magnetic supporter,
    wherein the second groove has a width greater than that of the magnetic supporter.

15. The method of claim 12, wherein the at least one guide opening is elongated in a direction different from a width direction and a length direction of the guide support.

16. The method of claim 15, wherein the magnet supporter is movable in the direction with respect to the guide support.

17. The method of claim 12, further comprising providing a cooling plate between the magnet plate assembly and the substrate.

18. The method of claim 11, wherein the at least one of the magnets is moved with respect to a surface on which the substrate is placed along a direction substantially parallel to the surface.

19. The method of claim 11, wherein the at least one of the magnets is moved along a direction which is substantially parallel to an edge of the substrate.

20. The method of claim 11, wherein the at least one of the magnets is moved along a direction which is substantially slanted with respect to an edge of the substrate.

* * * * *